United States Patent
Chen et al.

(10) Patent No.: US 12,314,107 B2
(45) Date of Patent: May 27, 2025

(54) METHOD, CIRCUIT AND APPARATUS FOR PROTECTING POWER SUPPLY OF PCIE CARD, AND MEDIUM

(71) Applicant: SUZHOU METABRAIN INTELLIGENT TECHNOLOGY CO., LTD., Jiangsu (CN)

(72) Inventors: Sanxia Chen, Jiangsu (CN); Tiejun Liu, Jiangsu (CN); Jing Ji, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/697,441

(22) PCT Filed: Jun. 28, 2022

(86) PCT No.: PCT/CN2022/102095
§ 371 (c)(1),
(2) Date: Mar. 29, 2024

(87) PCT Pub. No.: WO2023/134129
PCT Pub. Date: Jul. 20, 2023

(65) Prior Publication Data
US 2024/0329708 A1    Oct. 3, 2024

(30) Foreign Application Priority Data
Jan. 13, 2022   (CN) .......................... 202210034523.2

(51) Int. Cl.
*G06F 1/28*     (2006.01)
*G06F 1/26*     (2006.01)
(Continued)

(52) U.S. Cl.
CPC ................ *G06F 1/28* (2013.01); *G06F 1/266* (2013.01); *G06F 13/4068* (2013.01); *H01L 27/0266* (2013.01); *G06F 2213/0026* (2013.01)

(58) Field of Classification Search
CPC ........ G06F 1/28; G06F 1/266; G06F 13/4068; G06F 2213/0026; H01L 27/0266
See application file for complete search history.

(56) References Cited

U.S. PATENT DOCUMENTS 10,394,298 B1 *   8/2019   Chang ..................... G06F 13/42
11,837,866 B1 * 12/2023   Fang ....................... H02H 9/046
(Continued)

FOREIGN PATENT DOCUMENTS

CN    1527482 A    9/2004
CN    1728499 A    2/2006
(Continued)

OTHER PUBLICATIONS

International Search Report and Written Opinion received for PCT Application No. PCT/CN2022/102095 on Sep. 29, 2022, 10 pgs, with English translation.
(Continued)

*Primary Examiner* — Nimesh G Patel
(74) *Attorney, Agent, or Firm* — Merchant & Gould P.C.

(57) ABSTRACT

A method, circuit and apparatus for protecting power supply of a peripheral component interconnect express (PCIE) card, and a medium are provided card hardware design. When the PCIE card is not completely inserted into a slot of a server, a first power supply and a second power supply are controlled to release electric energy, a controller is controlled to turn off a first MOS transistor, and a load is charged with the electric energy released by the second power supply. When the PCIE card is completely inserted into the slot of the server, a PRSNT #signal is generated, a second MOS
(Continued)

transistor is controlled to be turned on, and the controller is controlled to turn on the first MOS transistor. When the PCIE card is not completely pulled out, the second MOS transistor is controlled to be turned off, and the controller is controlled to turn off the first MOS transistor.

20 Claims, 3 Drawing Sheets

(51) Int. Cl.
 *G06F 13/40* (2006.01)
 *H01L 27/02* (2006.01)

(56) References Cited

U.S. PATENT DOCUMENTS

| | | | |
|---|---|---|---|
| 2007/0136504 | A1 | 6/2007 | Wu |
| 2012/0151112 | A1* | 6/2012 | Paul ............... G06F 11/3034 710/303 |
| 2013/0058031 | A1 | 3/2013 | Brandyberry et al. |
| 2013/0060984 | A1 | 3/2013 | Brandyberry et al. |
| 2015/0171616 | A1* | 6/2015 | Tian ................... H02H 3/08 361/87 |
| 2016/0267035 | A1 | 9/2016 | Murphy |
| 2018/0356872 | A1* | 12/2018 | Loewen ............. G06F 1/3287 |
| 2019/0065295 | A1* | 2/2019 | Hsieh ................ G06F 3/0625 |
| 2022/0330450 | A1* | 10/2022 | Dillon ................ H02H 3/42 |

FOREIGN PATENT DOCUMENTS

| | | |
|---|---|---|
| CN | 101001299 A | 7/2007 |
| CN | 101741575 A | 6/2010 |
| CN | 103327656 A | 9/2013 |
| CN | 103345460 A | 10/2013 |
| CN | 104133533 A | 11/2014 |
| CN | 104716621 A | 6/2015 |
| CN | 204669389 U | 9/2015 |
| CN | 104967574 A | 10/2015 |
| CN | 205263726 U | 5/2016 |
| CN | 106292987 A | 1/2017 |
| CN | 106407148 A | 2/2017 |
| CN | 107133185 A | 9/2017 |
| CN | 108153695 A | 6/2018 |
| CN | 108255655 A | 7/2018 |
| CN | 109408441 A | 3/2019 |
| CN | 109917891 A | 6/2019 |
| CN | 109918244 A | 6/2019 |
| CN | 110674072 A | 1/2020 |
| CN | 110704348 A | 1/2020 |
| CN | 110780626 A | 2/2020 |
| CN | 110995221 A | 4/2020 |
| CN | 111049549 A | 4/2020 |
| CN | 111339010 A | 6/2020 |
| CN | 211148807 U | 7/2020 |
| CN | 111835631 A | 10/2020 |
| CN | 112181885 A | 1/2021 |
| CN | 112463689 A | 3/2021 |
| CN | 112467971 A | 3/2021 |
| CN | 213367403 U | 6/2021 |
| CN | 113204509 A | 8/2021 |
| CN | 113568855 A | 10/2021 |
| CN | 113595046 A | 11/2021 |
| CN | 214954954 U | 11/2021 |
| CN | 215268066 U | 12/2021 |
| CN | 114050714 A | 2/2022 |
| TW | 200941882 A | 10/2009 |
| WO | 2023/134129 A1 | 7/2023 |

OTHER PUBLICATIONS

Wang, Wei et al., "Micro TCA AMC (Non-official translation: Design and Realization of AMC Hot Plug in Micro TCA Computer)" (Industrial Control Computer), vol. 29, No. 05, May 25, 2016 (May 25, 2016), ISSN: 1001-182X, pp. 8-10.

Chinese Search Report received for Chinese Application No. 2022100345232 on Jan. 24, 2022, 8 pgs.

* cited by examiner

METHOD, CIRCUIT AND APPARATUS FOR PROTECTING POWER SUPPLY OF PCIE CARD, AND MEDIUM

CROSS-REFERENCE TO RELATED APPLICATIONS

The present application is a National Stage Application of PCT International Application No.: PCT/CN2022/102095 filed on Jun. 28, 2022, which claims priority to Chinese Patent Application 202210034523.2, filed in the China National Intellectual Property Administration on Jan. 13, 2022, the disclosure of which is incorporated herein by reference in its entirety.

TECHNICAL FIELD

The present disclosure relates to the field of card hardware design, and particularly relates to a method, circuit and apparatus for protecting power supply of a Peripheral Component Interconnect Express (PCIE) card, and a medium.

BACKGROUND

Peripheral Component Interconnect Express (PCIE, which is a type of high-speed serial computer expansion bus standard) cards have been applied in recent years. There is a tendency to insert the PCIE card into a motherboard of a server as a PCIE interface to fulfill specific functions. The PCIE card can be directly adjusted and used after inserted into a PCIE slot of a desktop computer or a server via a PCIE gold finger, and thus is simple, flexible and low in development cost. A power supply protection circuit will be required for the PCIE card during design, so as to prevent irreversible effect of hot swapping on the PCIE card and the server.

At present, in order to achieve power supply protection during hot swapping, a hot-swapping chip is mounted on the PCIE card to control an instantaneous current generated during hot swapping of the PCIE card. However, mounting the hot-swapping chip on the PCIE card will increase design cost of the PCIE card.

Thus, how to reduce cost of the PCIE card is an urgent problem to be solved by those having ordinary skill in the art.

SUMMARY

According to a first aspect, the embodiments of the present disclosure provide a circuit for protecting power supply of a Peripheral Component Interface Express (PCIE) card. The circuit includes: a first Metal Oxide Semiconductor (MOS) transistor, a second MOS transistor, a controller, a first resistor and a second resistor.

A first end of the first resistor is connected to a first power supply, and a second end of the first resistor is connected to a source of the second MOS transistor.

A first end of the second resistor is connected to the first power supply, and a second end of the second resistor is connected to a gate of the second MOS transistor.

A drain of the second MOS transistor is connected to a PRSNT #pin, the source of the second MOS transistor is connected to the controller, and the second MOS transistor is configured to transmit, in response to a case that the PCIE card is completely inserted into a slot of a server, a PRSNT #signal generated when the PRSNT #pin is grounded to the controller.

A first end of the controller is connected to a common end of the first resistor and the second MOS transistor, a second end of the controller is connected to the first MOS transistor, and the controller is configured to turn off, in response to a case that the PCIE card is not completely inserted into the slot of the server, the first MOS transistor according to an EV_PRSNT signal generated when the first power supply releases electric energy, and is configured to turn on, in response to the case that the PCIE card is completely inserted into the slot of the server, the first MOS transistor according to the PRSNT #signal.

A source of the first MOS transistor is connected to a second power supply, and is configured to transmit electric energy released by the second power supply.

In some embodiments, the controller includes a current pump, a first voltage comparator, a second voltage comparator and a third MOS transistor.

The current pump is connected to a gate of the first MOS transistor, and is configured to charge the gate of the first MOS transistor in response to the case that the PCIE card is completely inserted into the slot of the server.

A non-inverting input end of the first voltage comparator is connected to a drain of the first MOS transistor, an inverting input end of the first voltage comparator is connected to the source of the first MOS transistor, an output end of the first voltage comparator is connected to a gate of the third MOS transistor, and the first voltage comparator is configured to output a first voltage signal to the third MOS transistor according to a voltage difference between a drain voltage and a source voltage of the first MOS transistor.

A non-inverting input end of the second voltage comparator is connected to a common end of the first resistor and the second MOS transistor, an inverting input end of the second voltage comparator is grounded, an output end of the second voltage comparator is connected to the gate of the third MOS transistor, and the second voltage comparator is configured to output a second voltage signal to the third MOS transistor according to the EV_PRSNT signal, and output a third voltage signal to the third MOS transistor according to the PRSNT #signal.

A drain of the third MOS transistor is connected to the first MOS transistor, and a source of the third MOS transistor is connected to the second power supply.

According to a second aspect, the embodiments of the present disclosure further provide a method for protecting power supply of a PCIE card. The method is implemented by the circuit for protecting power supply of the PCIE card, and includes:

controlling, in response to a case that the PCIE card is not completely inserted into a slot of a server, a first power supply and a second power supply to release electric energy;

controlling, according to an EV_PRSNT signal generated when the first power supply releases the electric energy, a controller to turn off a first MOS transistor;

charging a load with the electric energy released by the second power supply;

generating, in response to a case that the PCIE card is completely inserted into the slot of the server, a PRSNT #signal according to a grounded PRSNT #pin;

controlling a second MOS transistor to be turned on, and controlling, according to the PRSNT #signal flowing through the second MOS transistor, the controller to turn on the first MOS transistor;

controlling, in response to a case that the PCIE card is not completely pulled out, the second MOS transistor to be turned off; and controlling, according to the EV_PRSNT signal, the controller to turn off the first MOS transistor.

In some embodiments, controlling the second MOS transistor to be turned on and controlling the second MOS transistor to be turned off include:

controlling, according to the PRSNT #signal, a voltage of the first power supply, voltages at two ends of the first resistor and voltages at two ends of the second resistor, the second MOS transistor to be turned on or off, wherein resistance of the first resistor is less than resistance of the second resistor.

In some embodiments, in response to the case that the PCIE card is not completely inserted into the slot of the server, before controlling the controller to turn off the first MOS transistor, the method further includes:

charging the controller with the electric energy released by the second power supply.

In some embodiments, charging the load with the electric energy released by the second power supply includes:

controlling the electric energy released by the second power supply to charge the load through a body diode of the first MOS transistor.

According to a third aspect, the embodiments of the present disclosure further provide an apparatus for protecting power supply of a PCIE card based on the circuit for protecting power supply of the PCIE card, and the apparatus includes:

a first control module, configured to control, in response to a case that the PCIE card is not completely inserted into a slot of a server, a first power supply and a second power supply to release electric energy;

a second control module, configured to control, according to an EV_PRSNT signal generated when the first power supply releases the electric energy, a controller to turn off a first MOS transistor;

a charging module, configured to charge a load with the electric energy released by the second power supply;

a generation module, configured to generate, in response to a case that the PCIE card is completely inserted into the slot of the server, a PRSNT #signal according to a grounded PRSNT #pin;

a third control module, configured to control the second MOS transistor to be turned on or off; and a fourth control module, configured to control, according to the PRSNT #signal flowing through the second MOS transistor, the controller to turn on the first MOS transistor.

According to a fourth aspect, the embodiments of the present disclosure further provide an apparatus for protecting power supply of a PCIE card based on the circuit for protecting power supply of the PCIE card, and the apparatus includes:

a memory, configured to store a computer program; and
a processor, configured to implement operations of the method for protecting power supply of the PCIE card when executing the computer program.

According to a fifth aspect, the embodiments of the present disclosure further provide a computer-readable storage medium. The computer-readable storage medium stores a computer program. The computer program, when executed by a processor, causes the processor to implement operations of the method for protecting power supply of the PCIE card.

Details of one or more embodiments of the present disclosure will be provided in the following accompanying drawings and description. Other features and advantages of the present disclosure will become apparent from the description, accompanying drawings and claims.

BRIEF DESCRIPTION OF THE DRAWINGS

In order to describe the embodiments of the present disclosure more clearly, accompanying drawings referred to in the embodiments will be briefly introduced. Apparently, the accompanying drawings in the following descriptions merely illustrate some embodiments of the present disclosure. Those having ordinary skill in the art would also have obtained other accompanying drawings according to these accompanying drawings without making creative efforts.

DETAILED DESCRIPTION

Technical solutions of the embodiments of the present disclosure will be clearly and completely described in combination with accompanying drawings of the embodiments of the present disclosure. Apparently, the embodiments described are merely some embodiments rather than all embodiments of the present disclosure. On the basis of embodiments of the present disclosure, all other embodiments obtained by those having ordinary skill in the art without making creative efforts fall within the scope of protection of the present disclosure.

The embodiments of the present disclosure provide a method for protecting power supply of a PCIE card, which is configured to suppress a surge current during hot swapping of a PCIE card to protect the PCIE card, and is able to reduce cost of the PCIE card.

In order to enable those having ordinary skill in the art to better understand the solution of the present disclosure, the technical solution of the present disclosure is further described in detail below in combination with accompanying drawings and particular embodiments.

Figure 1:
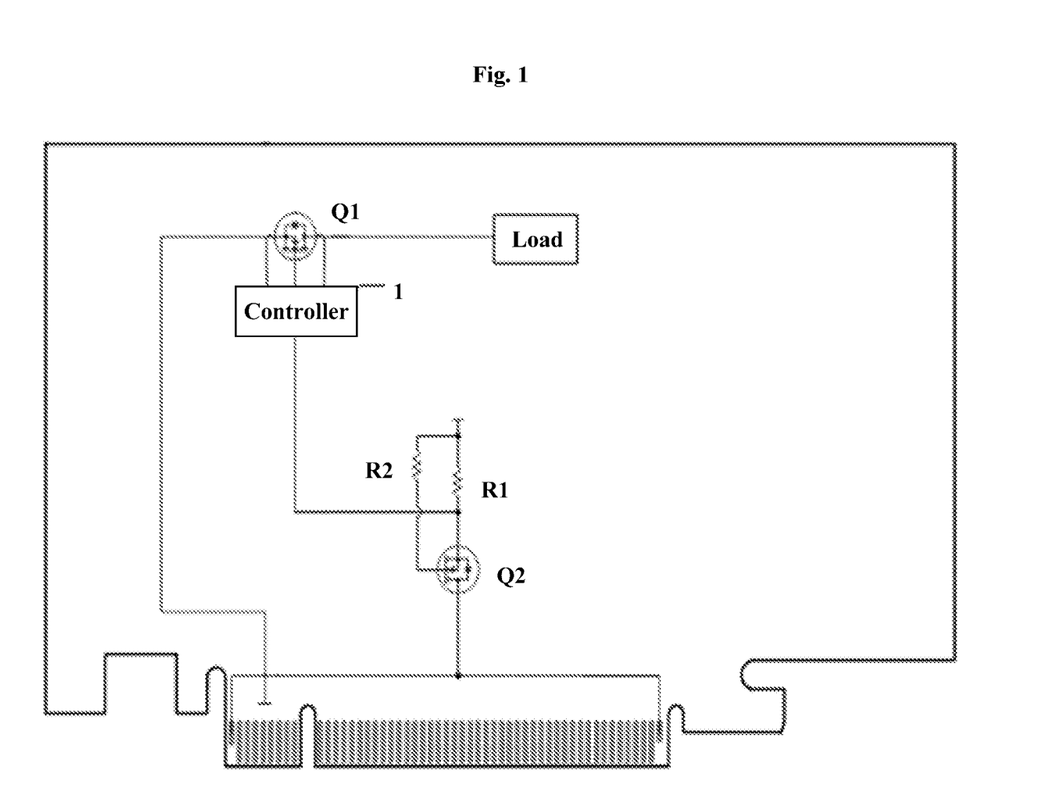
FIG. 1 is a structural diagram of a circuit for protecting power supply of a PCIE card according to some embodiments of the present disclosure.

FIG. 1 is a structural diagram of a circuit for protecting power supply of a PCIE card according to some embodiments of the present disclosure. The circuit for protecting power supply of the PCIE card shown in FIG. 1 is described below.

The circuit for protecting power supply of the PCIE card includes a first Metal Oxide Semiconductor (MOS) transistor Q1, a second MOS transistor Q2, a controller 1, a first resistor R1 and a second resistor R2. A first end of the first resistor R1 is connected to a first power supply, and a second end of the first resistor R1 is connected to a source of the second MOS transistor Q2. A first end of the second resistor R2 is connected to the first power supply, and a second end of the second resistor R2 is connected to a gate of the second MOS transistor Q2. A drain of the second MOS transistor Q2 is connected to a PRSNT #pin, the source of the second MOS transistor Q2 is connected to the controller 1, and the second MOS transistor is configured to transmit, when the PCIE card is completely inserted into a slot of a server, a PRSNT #signal generated when the PRSNT #pin is grounded to the controller 1. A first end of the controller 1 is connected to a common end of the first resistor R1 and the second MOS transistor Q2, a second end of the controller 1 is connected to the first MOS transistor Q1, and the controller 1 is configured to turn off, when the PCIE card is not completely inserted into the slot of the server, the first MOS transistor Q1 according to an EV_PRSNT signal generated when the first power supply releases electric energy, and is configured to turn on, when the PCIE card is completely inserted into the slot of the server, the first MOS transistor Q1 according to a PRSNT #signal. A source of the first MOS transistor Q1 is connected to a second power supply, and is configured to transmit electric energy released by the second power supply.

As shown in FIG. 1, the PRSNT #pin is shorter than a power pin on the PCIE card. In the embodiment, when the PCIE card is inserted into the slot of the server and the PRSNT #pin has not reached a preset position of the slot of the server in the process that the PCIE card is being inserted, it is considered that the PCIE card is not completely inserted into the slot of the server. In such a case, the first power supply and the second power supply both release electric energy, the PRSNT #signal generated by the PRSNT #pin is always in a high-level state under a pull-up action of the first resistor R1, and correspondingly, an EV_PRSNT signal generated when the first power supply releases the electric energy is also in a high-level state. Since the controller 1 turns off the first MOS transistor Q1 when receiving a high-level signal and turns on the first MOS transistor Q1 when receiving a low-level signal, the controller 1 keeps, according to the received EV_PRSNT signal, the first MOS transistor Q1 turned off, and in this case, the second power supply on a gold finger charges a load through a body diode of the first MOS transistor Q1. When the PRSNT #pin reaches the preset position of the slot of the server in the process that the PCIE card is being inserted, it is considered that the PCIE card is completely inserted into the slot of the server. In such a case, the PRSNT #pin is grounded by a short circuit of the PCIE card, the PRSNT #signal generated by the PRSNT #pin is in a low-level state, a source voltage of the second MOS transistor Q2 is a turn-on voltage of the body diode of the second MOS transistor Q2, and a gate voltage of the second MOS transistor Q2 is still in a high-level state under a pull-up action of the second resistor R2. Therefore, the gate voltage of the second MOS transistor Q2 is greater than the source voltage of the second MOS transistor Q2. When a voltage difference between the gate voltage and the source voltage of the second MOS transistor Q2 is greater than the turn-on voltage of the second MOS transistor Q2, the second MOS transistor Q2 is turned on, and the EV_PRSNT signal in a high-level state is pulled down to the ground by the PRSNT #signal flowing through the second MOS transistor Q2. That is, the voltage signal received by the controller 1 in this case is the PRSNT #signal in a low-level state. Since the PRSNT #signal is in a low-level state, the controller 1 turns on the first MOS transistor Q1 according to the PRSNT #signal, and in this case, the second power supply can directly charge the load. Since the second power supply already precharges the load via the body diode of the first MOS transistor Q1 when the PCIE card is not completely inserted into the slot of the server, a surge current generated when the PCIE card is inserted can be effectively reduced when the first MOS transistor Q1 is turned on. It should be noted that the preset position in the embodiment may be a position of a top of the PRSNT #pin when the PRSNT #pin is completely inserted into the slot of the server, or may be a two-third position of the top of the PRSNT #pin when the PRSNT #pin is completely inserted into the slot of the server, which is set according to actual situations and not limited in the embodiments.

In addition, in order to ensure that an insertion situation of the PCIE card can be accurately sensed, in the embodiments, two PRSNT #pins are arranged and located at two ends of a PCIE gold finger. The two PRSNT #pins are connected together, and a common end of the two PRSNT #pins is connected to the drain of the second MOS transistor Q2. When the PCIE card is completely inserted into the slot of the server, at least one PRSNT #pin will reach the preset position in the slot of the server and will be grounded via a short circuit of the PCIE card, such that the PRSNT #signal generated by the PRSNT #pin is in a low-level state. Apparently, the number of the PRSNT #pins is not limited to two, and positions of the PRSNT #pins are not limited to the two ends of the PCIE gold finger, which can be set according to actual situations. In the embodiments, the number and positions of the PRSNT #pins are not limited.

When the gold finger of the PCIE card is pulled out with electricity, the PRSNT #pin is the first to leave the slot of the server due to a short length. When the PRSNT #pin leaves the preset position of the slot of the server, the PRSNT #signal returns to be in a high-level state under a pull-up action of the first resistor R1. In this case, the voltage difference between the gate voltage and the source voltage of the second MOS transistor Q2 is not greater than the turn-on voltage of the second MOS transistor Q2, the second MOS transistor Q2 is turned off, and the EV_PRSNT signal also returns to be in a high-level state under the pull-up action of the first resistor R1. Moreover, the controller 1 turns off the first MOS transistor Q1 according to the EV_PRSNT signal, such that directional turn-off of the body diode of the first MOS transistor Q1 is achieved, and a surge current generated when the PCIE card is pulled out with electricity can be effectively suppressed. It should be noted that the high level and the low level are relative, and the high level in the embodiment of the present disclosure is a high voltage state relative to the low level. For instance, the situation that the EV_PRSNT signal is in a high-level state in the embodiment means that a voltage of the EV_PRSNT signal is greater than that in a low-level state of the PRSNT #signal generated when the PRSNT #pin is grounded.

A circuit for protecting power supply of a PCIE card is described in the embodiments. The circuit includes a first MOS transistor, a second MOS transistor, a controller, a first resistor and a second resistor. A first end of the first resistor is connected to a first power supply, and a second end of the first resistor is connected to a source of the second MOS transistor. A first end of the second resistor is connected to the first power supply, and a second end of the second resistor is connected to a gate of the second MOS transistor. A drain of the second MOS transistor is connected to a PRSNT #pin, the source of the second MOS transistor is connected to the controller, and the second MOS transistor is configured to transmit, in response to a case that the PCIE card is completely inserted into a slot of a server, a PRSNT #signal generated when the PRSNT #pin is grounded to the controller. A first end of the controller is connected to a common end of the first resistor and the second MOS transistor, a second end of the controller is connected to the first MOS transistor, and the controller is configured to turn off, in response to a case that the PCIE card is not completely inserted into the slot of the server, the first MOS transistor according to an EV_PRSNT signal generated when the first power supply releases electric energy, and is configured to turn on, in response to the case that the PCIE card is completely inserted into the slot of the server, the first MOS transistor according to the PRSNT #signal. A source of the first MOS transistor is connected to a second power supply, and is configured to transmit electric energy released by the second power supply. Since the first MOS transistor is turned off when the PCIE card is not completely inserted into the slot of the server, and the second power supply already precharges the load via the body diode of the first MOS transistor, a surge current generated when the PCIE card is completely inserted into the slot of the server, that is, when the first MOS transistor is turned on, can be effectively reduced. When the PCIE card is not completely pulled out, the load is disconnected from the second power supply by turning off the first MOS transistor, such that a surge current generated when the PCIE card is pulled out with electricity is suppressed, and the power supply of the PCIE card is effectively protected.

The structure of the controller 1 is not described in the above embodiment, and therefore the structure of the controller 1 will be supplementarily described in the following embodiment.

The controller 1 includes a current pump, a first voltage comparator, a second voltage comparator and a third MOS transistor. The current pump is connected to a gate of the first MOS transistor Q1, and is configured to charge the gate of the first MOS transistor in response to the case that the PCIE card is completely inserted into the slot of the server. A non-inverting input end of the first voltage comparator is connected to a drain of the first MOS transistor Q1, an inverting input end of the first voltage comparator is connected to a source of the first MOS transistor Q1, an output end of the first voltage comparator is connected to a gate of the third MOS transistor, and the first voltage comparator is configured to output a first voltage signal to the third MOS transistor according to a voltage difference between a drain voltage and a source voltage of the first MOS transistor Q1. A non-inverting input end of the second voltage comparator is connected to a common end of the first resistor R1 and the second MOS transistor Q2, an inverting input end of the second voltage comparator is grounded, an output end of the second voltage comparator is connected to the gate of the third MOS transistor, and the second voltage comparator is configured to output a second voltage signal to the third MOS transistor according to the EV_PRSNT signal, and output a third voltage signal to the third MOS transistor according to the PRSNT #signal. A drain of the third MOS transistor is connected to the first MOS transistor Q1, and a source of the third MOS transistor is connected to the second power supply.

When the PCIE card is just inserted into the slot of the server, the first MOS transistor Q1 is turned off, and electric energy released by the second power supply charges a load through a body diode of the first MOS transistor Q1. As the PCIE card is further inserted, when the PCIE card is completely inserted into the slot of the server, the controller 1 receives a PRSNT #signal in a low-level state. After the controller 1 receives the PRSNT #signal, the current pump charges the gate of the first MOS transistor Q1 until the gate voltage of the first MOS transistor Q1 is greater than the source voltage of the first MOS transistor Q1, and the first MOS transistor Q1 is turned on. In this case, the second power supply can charge the load via the first MOS transistor Q1. In addition, in order to prevent a surge current from being generated when the first MOS transistor Q1 is turned on, the first voltage comparator collects the drain voltage and the source voltage of the first MOS transistor Q1, and outputs a first voltage signal to the third MOS transistor according to the voltage difference between the drain voltage and the source voltage of the first MOS transistor Q1. If the voltage difference between the drain voltage and the source voltage of the first MOS transistor Q1 exceeds a threshold voltage, it is considered that a surge current is generated. In this case, the first voltage signal output by the first voltage comparator to the gate of the third MOS transistor is in a high-level state, and the third MOS transistor is turned on, such that the gate and the source of the first MOS transistor Q1 are connected, that is, the gate voltage and the source voltage of the first MOS transistor Q1 are equal. Therefore, the first MOS transistor Q1 is turned off, the second power supply is disconnected from the load, and the surge current generated can be effectively suppressed. If the voltage difference between the drain voltage and the source voltage of the first MOS transistor Q1 does not exceed the threshold voltage, the first voltage signal output by the first voltage comparator to the gate of the third MOS transistor is in a low-level state. In this case, it is considered that no surge current is generated, and the third MOS transistor cannot be turned on according to the first voltage signal. It should be noted that a reverse voltage protection point of 30 mV is set in the embodiment. That is, the threshold voltage is set to 30 m V. When the voltage difference between the drain voltage and the source voltage of the first MOS transistor Q1 collected by the first voltage comparator is greater than 30 m V, the first voltage signal output by the first voltage comparator to the gate of the third MOS transistor is in a high-level state. Apparently, the threshold voltage is not limited to 30 mV, and an appropriate threshold voltage may be selected according to actual situations and is not limited in the embodiment.

In addition, when the PCIE card is not completely inserted into the slot of the server, the non-inverting input end of the second voltage comparator receives the EV_PRSNT signal generated when the first power supply releases electric energy. Since the EV_PRSNT signal is in a high-level state, the second voltage signal output to the gate of the third MOS transistor is in a high-level state. In this case, the third MOS transistor is turned on, and the gate and the source of the first MOS transistor Q1 are connected, such that a turn-on condition of the first MOS transistor Q1 is not satisfied, and the first MOS transistor Q1 is turned off when the PCIE card is not completely inserted into the slot of the server. When the PCIE card is completely inserted into the slot of the server, the PRSNT #signal received by the non-inverting input end of the second voltage comparator is in a low-level state, such that the third voltage signal output to the gate of the third MOS transistor is in a low-level state. In this case, the gate voltage of the third MOS transistor is not greater than the source voltage of the third MOS transistor, a turn-on condition of the third MOS transistor is not satisfied, and the third MOS transistor is turned off. Since the current pump charges the gate of the first MOS transistor Q1 after the controller 1 receives the PRSNT #signal, when the gate voltage of the first MOS transistor Q1 is greater than the source voltage of third MOS transistor Q1, the first MOS transistor Q1 is turned on. In this way, the first MOS transistor Q1 is turned on when the PCIE card is completely inserted into the slot of the server. It should be noted that the output end of the first voltage comparator and the output end of the second voltage comparator are connected to the gate of the third MOS transistor via a NOT gate circuit. That is, as long as one of an output end of the first voltage comparator and an output end the second voltage comparator outputs a high level, the voltage signal received by the gate of the third MOS transistor is in a high-level state, and in this case, the third MOS transistor is turned on and the first MOS transistor Q1 is turned off.

In the embodiment, the structure of the controller is described in detail. The controller includes a current pump, a first voltage comparator, a second voltage comparator and a third MOS transistor. The current pump is connected to a gate of the first MOS transistor, and is configured to charge the gate of the first MOS transistor in response to the case that the PCIE card is completely inserted into the slot of the server. A non-inverting input end of the first voltage comparator is connected to a drain of the first MOS transistor, an inverting input end of the first voltage comparator is connected to the source of the first MOS transistor, an output end of the first voltage comparator is connected to a gate of the third MOS transistor, and the first voltage comparator is configured to output a first voltage signal to the third MOS transistor according to a voltage difference between a drain voltage and a source voltage of the first MOS transistor. A non-inverting input end of the second voltage comparator is connected to a common end of the first resistor and the second MOS transistor, an inverting input end of the second voltage comparator is grounded, an output end of the second voltage comparator is connected to the gate of the third MOS transistor, and the second voltage comparator is configured to output a second voltage signal to the third MOS transistor according to the EV_PRSNT signal, and output a third voltage signal to the third MOS transistor according to the PRSNT #signal. A drain of the third MOS transistor is connected to the first MOS transistor, and a source of the third MOS transistor is connected to the second power supply. In the embodiment, the second voltage comparator outputs a corresponding voltage signal to the third MOS transistor according to the EV_PRSNT signal and the PRSNT #signal, turns off the first MOS transistor by turning on the third MOS transistor, and turns on the first MOS transistor by turning off the third MOS transistor, so as to control the first MOS transistor to be turned on or off. In addition, the first voltage comparator monitors the drain voltage and the source voltage of the first MOS transistor, and outputs a first voltage signal in a high-level state to the third MOS transistor when the voltage difference between the drain voltage and the source voltage of the first MOS transistor is greater than a threshold voltage, so as to turn off the first MOS transistor. Therefore, a surge current is effectively suppressed, and the power supply of the PCIE card is protected.

Figure 2:
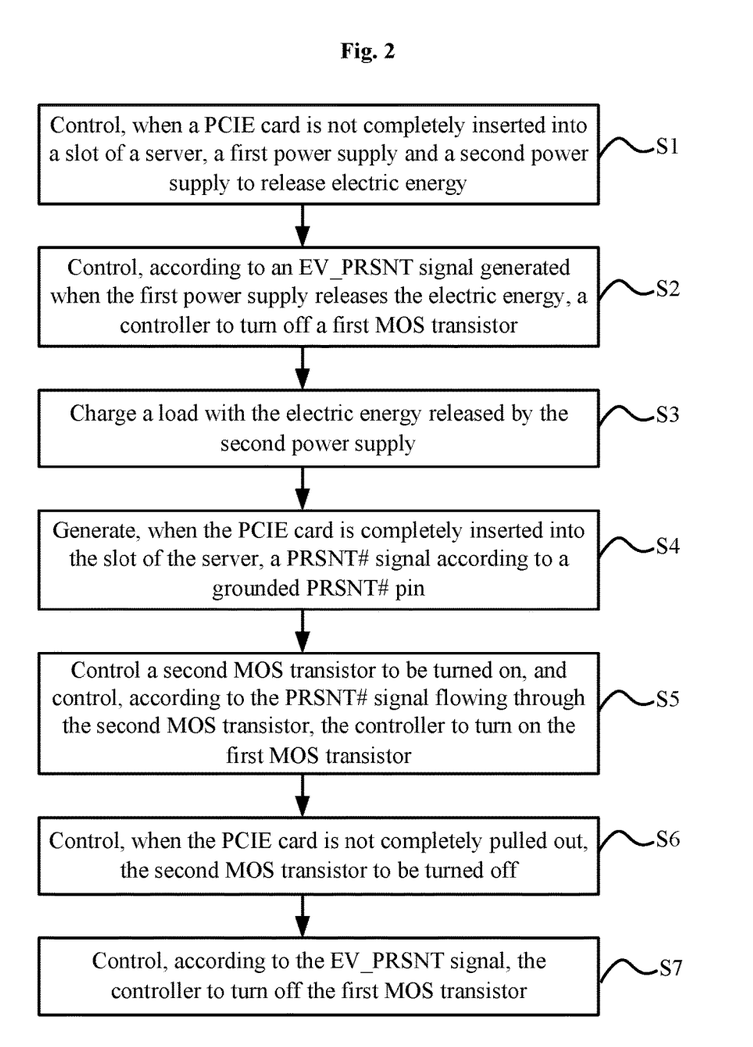
FIG. 2 is a flow diagram of a method for protecting power supply of a PCIE card according to some embodiments of the present disclosure.

FIG. 2 is a flow diagram of a method for protecting power supply of a PCIE card according to some embodiments of the present disclosure. The method is implemented by the circuit for protecting power supply of the PCIE card in the above embodiment. As shown in FIG. 2, the method includes the following operations S1 to S7.

In operation S1, in response to a case that the PCIE card is not completely inserted into a slot of a server, a first power supply and a second power supply are controlled to release electric energy.

In operation S2, a controller is controlled, according to an EV_PRSNT signal generated when the first power supply releases the electric energy, to turn off a first MOS transistor.

In operation S3, a load is charged with the electric energy released by the second power supply.

In operation S4, in response to a case that the PCIE card is completely inserted into the slot of the server, a PRSNT #signal is generated according to a grounded PRSNT #pin.

In operation S5, a second MOS transistor is controlled to be turned on, and the controller is controlled, according to the PRSNT #signal flowing through the second MOS transistor, to turn on the first MOS transistor.

In operation S6, in response to a case that the PCIE card is not completely pulled out, the second MOS transistor is controlled to be turned off.

In operation S7, the controller is controlled, according to the EV_PRSNT signal, to turn off the first MOS transistor.

In the embodiment, when the PCIE card is not completely inserted into the slot of the server, the PCIE card first controls the first power supply and the second power supply to release electric energy. In this case, the controller receives the EV_PRSNT signal generated when the first power supply releases electric energy. Since the EV_PRSNT signal is in a high-level state under an action of a pull-up resistor, and the controller will turn off an external MOS transistor when receiving a voltage signal in a high-level state in the above embodiment, the PCIE card will turn off the first MOS transistor via the controller. Moreover, the electric energy released by the second power supply can charge the load only via the body diode of the first MOS transistor. When the PCIE card is completely inserted into the slot of the server, the PRSNT #pin is grounded by the short circuit of the PCIE card, and a PRSNT #signal is generated. In this case, the PCIE card will control the second MOS transistor to be turned on, and the PRSNT #signal flows through the second MOS transistor, such that the EV_PRSNT signal is pulled down for grounding. Therefore, the voltage signal received by the controller is no longer the EV_PRSNT signal in a high-level state, but the PRSNT #signal in a low-level state. The controller will turn on the first MOS transistor according to the PRSNT #signal. Since the first MOS transistor is enabled to start working, the second power supply can normally charge the load via the first MOS transistor. When the PCIE card is not completely pulled out, the PRSNT #pin is short and will be first disconnected from the short circuit, and therefore the second MOS transistor will be turned off. In this case, the controller receives the EV_PRSNT signal still in a high-level state. Moreover, according to the EV_PRSNT signal, the controller will turn off the first MOS transistor, such that the load is disconnected from the power supply.

The embodiment provides a method for protecting power supply of a PCIE card. The method is implemented by the circuit for protecting power supply of the PCIE card mentioned in the above embodiment. According to the method, when a PCIE card is not completely inserted into a slot of a server, a first power supply and a second power supply are controlled to release electric energy. A controller is controlled, according to an EV_PRSNT signal generated when the first power supply releases the electric energy, to turn off a first MOS transistor, and a load is charged with the electric energy released by the second power supply. When the PCIE card is completely inserted into the slot of the server, a PRSNT #signal is generated according to a grounded PRSNT #pin, the second MOS transistor is controlled to be turned on, and the controller is controlled to turn on the first MOS transistor according to a PRSNT #signal flowing through the second MOS transistor. When the PCIE card is not completely pulled out, the second MOS transistor is controlled to be turned off, and the controller is controlled, according to the EV_PRSNT signal, to turn off the first MOS transistor. According to the method, when the PCIE card is not completely inserted into the slot of the server, the second power supply charges the load via the body diode of the first MOS transistor, such that a surge current generated when the PCIE card is inserted is reduced through pre-charging. When the PCIE card is not completely pulled out, the load is disconnected from the second power supply by turning off the first MOS transistor, such that a surge current generated when the PCIE card is pulled out with electricity is suppressed, and hot swapping protection is achieved.

On the basis of the above embodiment, the operation of controlling the second MOS transistor to be turned on and the operation of controlling the second MOS transistor to be turned off are supplementarily described in the embodiment. The operations include:

The second MOS transistor is controlled to be turned on or off according to the PRSNT #signal, a voltage of the first power supply, voltages at two ends of the first resistor and voltages at two ends of the second resistor. Resistance of the first resistor is less than resistance of the second resistor.

In some exemplary implementations, a gate voltage of the second MOS transistor is a voltage difference between a voltage of the first power supply and voltages of two ends of the second resistor, and a source voltage of the second MOS transistor is a voltage difference between the voltage of the first power supply and voltages at two ends of the first resistor. When the PCIE card is not completely inserted into the slot of the server, since resistance of the first resistor is less than resistance of the second resistor, a source voltage of the second MOS transistor is greater than a gate voltage of the second MOS transistor, and a turn-on condition of the second MOS transistor is not satisfied. When the PCIE card is completely inserted into the slot of the server, the source voltage of the second MOS transistor will be reduced under a pull-down action of the PRSNT #signal. When the source voltage of the second MOS transistor is reduced until the voltage difference between the gate voltage and the source voltage of the second MOS transistor is greater than the turn-on voltage of the second MOS transistor, and the second MOS transistor is turned on. Correspondingly, when the PCIE card is pulled out, the source voltage of the second MOS transistor will be increased until a turn-on condition of the second MOS transistor is not satisfied, and the second MOS transistor is turned off.

Since the voltage signal received by the controller when the second MOS transistor is turned off is the EV_PRSNT signal in a high-level state, and the voltage signal received by the controller when the second MOS transistor is turned on is the PRSNT #signal in a low-level state, the operation of controlling the second MOS transistor to be turned on and the operation of controlling the second MOS transistor to be turned off are described in detail in the embodiment. Therefore, the controller can control the first MOS transistor to be turned on or off according to different voltage signals received when the second MOS transistor is turned on or off.

On the basis of the above embodiment, if the PCIE card is not completely inserted into the slot of the server, before the operation of controlling the controller to turn off the first MOS transistor, the method further includes charge the controller with the electric energy released by the second power supply.

In some exemplary implementations, when the PCIE card is not completely inserted into the slot of the server, the electric energy released by the second power supply provides voltage input for the current pump in the controller such that the gate of the first MOS transistor can be charged when the PCIE card is completely inserted into the slot of the server. In addition, the first voltage comparator in the controller collects the electric energy released by the second power supply, and outputs a first voltage signal to the third MOS transistor according to the voltage difference between the drain voltage and the source voltage of the first MOS transistor. When the voltage difference between the drain voltage and the source voltage of the first MOS transistor exceeds the threshold voltage, the output first voltage signal is in a high-level state, and the third MOS transistor is turned on. Therefore, the gate voltage and the source voltage of the first MOS transistor are equal, and the first MOS transistor is turned off. A situation that a surge current is generated when the second power supply releases electric energy to damage the power supply is effectively prevented.

On the basis of the above embodiment, when the PCIE card is not completely inserted into the slot of the server, the second power supply releases electric energy. In this case, the operation of charging the load with the electric energy released by the second power supply includes control the electric energy released by the second power supply to charge the load via the body diode of the first MOS transistor.

When the PCIE card is not completely inserted into the slot of the server, since the first MOS transistor is turned off, the electric energy released by the second power supply can charge the load only via the body diode of the first MOS transistor. That is, the electric energy released by the second power supply is limited to charge the load in a low current mode. That is, pre-charging is carried out when the PCIE card is not completely inserted into the slot of the server. Therefore, a surge current generated when the PCIE card is inserted is reduced through pre-charging, and the power supply of the PCIE card is effectively protected.

In the above embodiment, the method for protecting power supply of the PCIE card is described in detail, and the embodiments of the present disclosure further provide a corresponding embodiment of an apparatus for protecting power supply of a PCIE card. It should be noted that an embodiment of the apparatus is described from two perspectives in the present disclosure, one is based on a functional module, and the other one is based on hardware.

Figure 3:
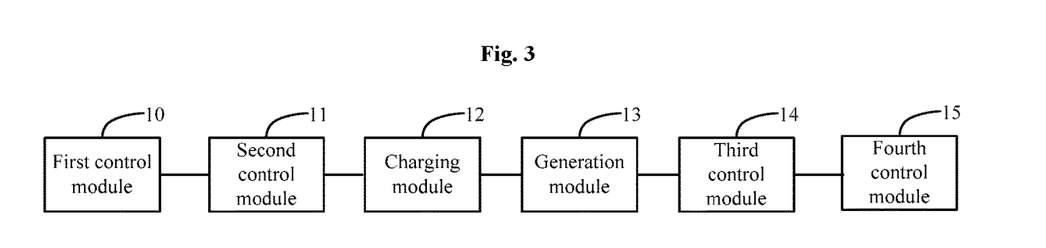
FIG. 3 is a structural diagram of an apparatus for protecting power supply of a PCIE card according to some embodiments of the present disclosure.

FIG. 3 is a structural diagram of an apparatus for protecting power supply of a PCIE card according to some embodiments of the present disclosure. As shown in FIG. 3, the apparatus is based on the circuit for protecting power supply of the PCIE card in the above embodiment, and includes:

a first control module 10, configured to control, in response to a case that the PCIE card is not completely inserted into a slot of a server, a first power supply and a second power supply to release electric energy;

a second control module 11, configured to control, according to an EV_PRSNT signal generated when the first power supply releases the electric energy, a controller to turn off a first MOS transistor:

a charging module 12, configured to charge a load with the electric energy released by the second power supply;

a generation module 13, configured to generate, in response to a case that the PCIE card is completely inserted into the slot of the server, a PRSNT #signal according to a grounded PRSNT #pin;

a third control module 14, configured to control the second MOS transistor to be turned on or off; and a fourth control module 15, configured to control, according to the PRSNT #signal flowing through the second MOS transistor, the controller to turn on the first MOS transistor.

Since the embodiment of the apparatus corresponds to the embodiment of the method, the embodiment of the apparatus can be seen with reference to the description of the embodiment of the method, which will not be repeated herein.

According to the apparatus for protecting power supply of a PCIE card provided in the embodiment, when the PCIE card is not completely inserted into the slot of the server, the first control module controls the first power supply and the second power supply to release electric energy. The second control module controls, according to the EV_PRSNT signal generated when the first power supply releases electric energy, the controller to turn off the first MOS transistor. Then, the charging module charges the load with the electric energy released by the second power supply. When the PCIE card is completely inserted into the slot of the server, the generation module generates a PRSNT #signal according to a grounded PRSNT #pin. The third control module controls the second MOS transistor to be turned on or off. The fourth control module controls, according to the PRSNT #signal flowing through the second MOS transistor, the controller to turn on the first MOS transistor. According to the apparatus, when the PCIE card is not completely inserted into the slot of the server, the charging module charges the load with the electric energy released by the second power supply. Since the first MOS transistor is turned off, the electric energy released by the second power supply can charge the load only via the body diode of the first MOS transistor in a low-current mode in this case. Therefore, a surge current generated when the PCIE card is inserted is effectively reduced through pre-charging. When the PCIE card is not completely pulled out, the load is disconnected from the second power supply by turning off the first MOS transistor. Therefore, a surge current generated when the PCIE card is pulled out with electricity is suppressed, and hot swapping protection is achieved.

Figure 4:
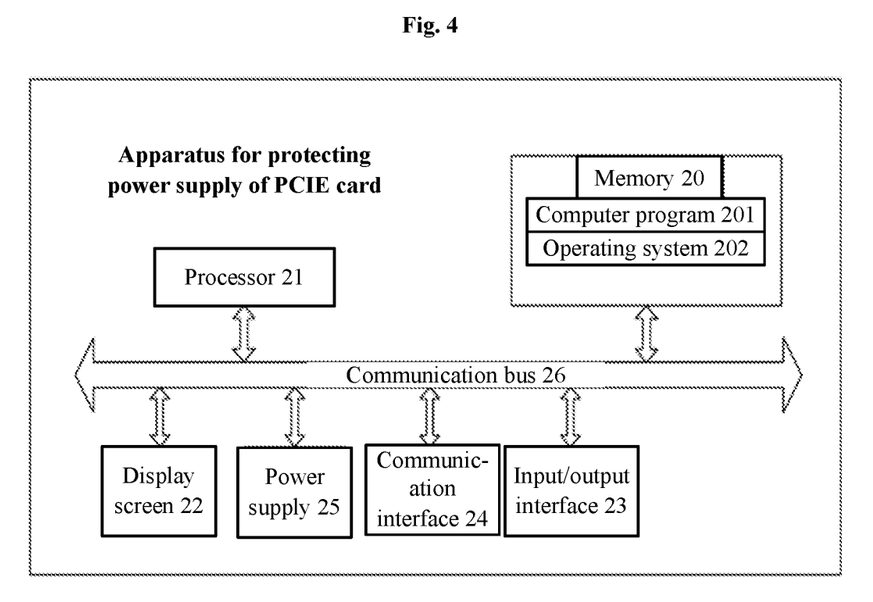
FIG. 4 is a structural diagram of another apparatus for protecting power supply of a PCIE card according to some embodiments of the present disclosure.

FIG. 4 is a structural diagram of an apparatus for protecting power supply of a PCIE card according to another embodiment of the present disclosure, which is based on the circuit for protecting power supply of the PCIE card in the above embodiment. As shown in FIG. 4, the apparatus for protecting power supply of a PCIE card includes:

a memory 20, configured to store a computer program; and a processor 21, configured to implement operations of the method for protecting power supply of the PCIE card as mentioned in the above embodiment when executing the computer program.

The apparatus for protecting power supply of a PCIE card provided in the embodiment may include, but is not limited to, a smart phone, a tablet computer, a notebook computer or a desktop computer.

The processor 21 may include one or more processing cores, such as a 4-core processor and an 8-core processor. The processor 21 may be implemented in at least one hardware form of a Digital Signal Processor (DSP), a Field-Programmable Gate Array (FPGA) and a Programmable Logic Array (PLA). The processor 21 may also include a main processor and a coprocessor. The main processor is a processor for processing data in an awake state, and is also referred to as a Central Processing Unit (CPU). The coprocessor is a low power consumption processor for processing data in a standby state. In some embodiments, the processor 21 may be integrated with a Graphics Processing Unit (GPU). The GPU is responsible for rendering and drawing content required to be displayed on a display screen. In some embodiments, the processor 21 may further include an Artificial Intelligence (AI) processor. The AI processor is configured to process computational operations related to machine learning.

The memory 20 may include one or more computer-readable storage media. The computer-readable storage media may be non-transitory. The memory 20 may also include a high speed random access memory and a nonvolatile memory, such as one or more disk storage devices and flash storage devices. In the embodiment, the memory 20 is configured to store at least the following computer program 201. After the computer program is loaded and executed by the processor 21, relevant operations of the method for protecting power supply of the PCIE card disclosed in any one of the foregoing embodiments can be implemented. In addition, resources stored in the memory 20 may further include an operating system 202, etc., and the storage mode may be temporary storage or permanent storage. The operating system 202 may include Windows, Unix, Linux, etc.

In some embodiments, the apparatus for protecting power supply of a PCIE card may further include a display screen 22, an input/output interface 23, a communication interface 24, a power supply 25 and a communication bus 26.

Those having ordinary skill in the art would have understood that the structure shown in FIG. 4 is not intended to limit the apparatus for protecting power supply of a PCIE card and may include more or less assemblies than those shown.

The apparatus for protecting power supply of a PCIE card provided in the embodiment of the present disclosure includes a memory and a processor. The processor can implement the method for protecting power supply of the PCIE card when executing the program stored in the memory. An effect is the same as above.

Finally, the embodiments of the present disclosure further provide an embodiment corresponding to a computer-readable storage medium. The computer-readable storage medium stores a computer program. The computer program implements operations of the method for protecting power supply of the PCIE card as recited in the above method embodiment when executed by the processor.

It can be understood that if the method in the above embodiment is implemented as a software functional unit and sold or used as a stand-alone product, they may be stored in a computer-readable storage medium. On the basis of such understanding, the technical solution of the present disclosure essentially, a part contributing to the prior art or all or some of the technical solution can be embodied in the form of a software product, and the computer software product is stored in a storage medium to execute all or some of the operations of the method described in each embodiment of the present disclosure. The foregoing storage medium includes various media capable of storing program codes, such as a Universal Serial Bus (USB) flash drive, a removable hard disk, a Read-Only Memory (ROM), a Random Access Memory (RAM), a magnetic disk or an optical disk.

The computer-readable storage medium provided in the present disclosure includes the method for protecting power supply of the PCIE card mentioned above. An effect is the same as above.

The method, circuit and apparatus for protecting power supply of a PCIE card, and the medium provided in the present disclosure are described in detail. Each embodiment of the description is described in a progressive manner, each embodiment focuses on the differences from other embodiments, and the same and similar parts between the embodiments can be seen with reference to each other. Since an apparatus disclosed in an embodiment corresponds to a method disclosed in an embodiment, the description is relatively simple, and relevant content can be seen from the description of the method. It should be noted that several improvements and modifications can also be made by those having ordinary skill in the art without departing from the principles of the present disclosure. These improvements and modifications also fall within the scope of protection of the present disclosure.

It should be noted that relational terms such as first and second herein are merely used to distinguish one entity or operation from another entity or operation without certainly requiring or implying any such actual relation or order between such entities or operations. In addition, terms "include", "comprise" or their any other variations are intended to cover non-exclusive inclusions, such that a process, a method, an article or a device including a series of elements not only includes those elements, but also includes other elements that are not explicitly listed, or also includes inherent elements of such a process, a method, an article or a device. Under the circumstance of no more limitations, an element limited by sentence "including a . . . " or "comprising a . . . " does not exclude that there are other same elements in a process, a method, an article or a device including the element.

What is claimed is:

1. A circuit for protecting power supply of a Peripheral Component Interface Express (PCIE) card, the circuit comprising: a first Metal Oxide Semiconductor (MOS) transistor, a second MOS transistor, a controller, a first resistor and a second resistor; wherein
a first end of the first resistor is connected to a first power supply, and a second end of the first resistor is connected to a source of the second MOS transistor;
a first end of the second resistor is connected to the first power supply, and a second end of the second resistor is connected to a gate of the second MOS transistor;
a drain of the second MOS transistor is connected to a PRSNT #pin, the source of the second MOS transistor is connected to the controller, and the second MOS transistor is configured to transmit, in response to a case that the PCIE card is completely inserted into a slot of a server, a PRSNT #signal generated when the PRSNT #pin is grounded to the controller;
a first end of the controller is connected to a common end of the first resistor and the second MOS transistor, a second end of the controller is connected to the first MOS transistor, and the controller is configured to turn off, in response to a case that the PCIE card is not completely inserted into the slot of the server, the first MOS transistor according to an EV_PRSNT signal generated when the first power supply releases electric energy, and is configured to turn on, in response to the case that the PCIE card is completely inserted into the slot of the server, the first MOS transistor according to the PRSNT #signal; and
a source of the first MOS transistor is connected to a second power supply, and is configured to transmit electric energy released by the second power supply.

2. The circuit for protecting power supply of the PCIE card according to claim 1, wherein the controller comprises a current pump, a first voltage comparator, a second voltage comparator and a third MOS transistor;
the current pump is connected to a gate of the first MOS transistor, and is configured to charge the gate of the first MOS transistor in response to the case that the PCIE card is completely inserted into the slot of the server;
a non-inverting input end of the first voltage comparator is connected to a drain of the first MOS transistor, an inverting input end of the first voltage comparator is connected to the source of the first MOS transistor, an output end of the first voltage comparator is connected to a gate of the third MOS transistor, and the first voltage comparator is configured to output a first voltage signal to the third MOS transistor according to a voltage difference between a drain voltage and a source voltage of the first MOS transistor;
a non-inverting input end of the second voltage comparator is connected to a common end of the first resistor and the second MOS transistor, an inverting input end of the second voltage comparator is grounded, an output end of the second voltage comparator is connected to the gate of the third MOS transistor, and the second voltage comparator is configured to output a second voltage signal to the third MOS transistor according to the EV_PRSNT signal, and output a third voltage signal to the third MOS transistor according to the PRSNT #signal; and
a drain of the third MOS transistor is connected to the first MOS transistor, and a source of the third MOS transistor is connected to the second power supply.

3. The circuit for protecting power supply of the PCIE card according to claim 2, wherein the output end of the first voltage comparator and the output end of the second voltage comparator of the controller are connected to the gate of the third MOS transistor via a NOT gate circuit, and as long as one of an output end of the first voltage comparator and an output end the second voltage comparator outputs a high level, the voltage signal received by the gate of the third MOS transistor is in a high-level state, and the third MOS transistor is turned on and the first MOS transistor Q1 is turned off.

4. A method for protecting power supply of a Peripheral Component Interface Express (PCIE) card, implemented by the circuit for protecting power supply of the PCIE card according to claim 1, and the method comprising:
controlling, in response to a case that the PCIE card is not completely inserted into a slot of a server, a first power supply and a second power supply to release electric energy;
controlling, according to an EV_PRSNT signal generated when the first power supply releases the electric energy, a controller to turn off a first MOS transistor;
charging a load with the electric energy released by the second power supply;
generating, in response to a case that the PCIE card is completely inserted into the slot of the server, a PRSNT #signal according to a grounded PRSNT #pin;
controlling a second MOS transistor to be turned on, and controlling, according to the PRSNT #signal flowing through the second MOS transistor, the controller to turn on the first MOS transistor;
controlling, in response to a case that the PCIE card is not completely pulled out, the second MOS transistor to be turned off; and
controlling, according to the EV_PRSNT signal, the controller to turn off the first MOS transistor.

5. The method for protecting power supply of the PCIE card according to claim 4, wherein controlling the second MOS transistor to be turned on and controlling the second MOS transistor to be turned off comprise:
controlling, according to the PRSNT #signal, a voltage of the first power supply, voltages at two ends of the first resistor and voltages at two ends of the second resistor, the second MOS transistor to be turned on or off, wherein resistance of the first resistor is less than resistance of the second resistor.

6. The method for protecting power supply of the PCIE card according to claim 4, wherein in response to the case that the PCIE card is not completely inserted into the slot of the server, before controlling the controller to turn off the first MOS transistor, the method further comprises:
  charging the controller with the electric energy released by the second power supply.

7. The method for protecting power supply of the PCIE card according to claim 4, wherein charging the load with the electric energy released by the second power supply comprises:
  controlling the electric energy released by the second power supply to charge the load through a body diode of the first MOS transistor.

8. A computer device for protecting power supply of a Peripheral Component Interface Express (PCIE) card based on the circuit for protecting power supply of the PCIE card according to claim 1, and the computer device comprising:
  a memory, configured to store a computer-readable instruction; and
  a processor, configured to implement the following operations when executing the computer-readable instruction:
  controlling, in response to a case that the PCIE card is not completely inserted into a slot of a server, a first power supply and a second power supply to release electric energy;
  controlling, according to an EV_PRSNT signal generated when the first power supply releases the electric energy, a controller to turn off a first MOS transistor;
  charging a load with the electric energy released by the second power supply;
  generating, in response to a case that the PCIE card is completely inserted into the slot of the server, a PRSNT# signal according to a grounded PRSNT# pin;
  controlling a second MOS transistor to be turned on, and controlling, according to the PRSNT# signal flowing through the second MOS transistor, the controller to turn on the first MOS transistor;
  controlling, in response to a case that the PCIE card is not completely pulled out, the second MOS transistor to be turned off; and
  controlling, according to the EV_PRSNT signal, the controller to turn off the first MOS transistor.

9. A non-transitory computer-readable storage medium, storing a computer-readable instruction, wherein the computer-readable instruction, when executed by a processor, causes the processor to implement the following operations of the method for protecting power supply of the PCIE card implemented by the circuit for protecting power supply of the PCIE card according to claim 1
  controlling, in response to a case that the PCIE card is not completely inserted into a slot of a server, a first power supply and a second power supply to release electric energy;
  controlling, according to an EV_PRSNT signal generated when the first power supply releases the electric energy, a controller to turn off a first MOS transistor;
  charging a load with the electric energy released by the second power supply;
  generating, in response to a case that the PCIE card is completely inserted into the slot of the server, a PRSNT #signal according to a grounded PRSNT# pin;
  controlling a second MOS transistor to be turned on, and controlling, according to the PRSNT# signal flowing through the second MOS transistor, the controller to turn on the first MOS transistor;
  controlling, in response to a case that the PCIE card is not completely pulled out, the second MOS transistor to be turned off; and
  controlling, according to the EV_PRSNT signal, the controller to turn off the first MOS transistor.

10. The circuit for protecting power supply of the PCIE card according to claim 1, wherein the PRSNT #pin is shorter than a power pin on the PCIE card.

11. The circuit for protecting power supply of the PCIE card according to claim 1, wherein in a case where the PCIE card is inserted into the slot of the server and the PRSNT #pin has not reached a preset position of the slot of the server in a process that the PCIE card is being inserted, it is determined that the PCIE card is not completely inserted into the slot of the server, the first power supply and the second power supply both release electric energy, the PRSNT #signal generated by the PRSNT #pin is always in a high-level state under a pull-up action of the first resistor, and correspondingly, the EV_PRSNT signal generated when the first power supply releases the electric energy is also in a high-level state.

12. The circuit for protecting power supply of the PCIE card according to claim 11, wherein the controller turns off the first MOS transistor when receiving a high-level signal and turns on the first MOS transistor when receiving a low-level signal, and the controller keeps, according to the received EV_PRSNT signal, the first MOS transistor turned off, and the second power supply on a gold finger charges a load through a body diode of the first MOS transistor.

13. The circuit for protecting power supply of the PCIE card according to claim 11, wherein the preset position is a position of a top of the PRSNT #pin when the PRSNT #pin is completely inserted into the slot of the server, or is a two-third position of the top of the PRSNT #pin when the PRSNT #pin is completely inserted into the slot of the server.

14. The circuit for protecting power supply of the PCIE card according to claim 1, wherein when the PRSNT #pin reaches a preset position of the slot of the server in a process that the PCIE card is being inserted, it is determined that the PCIE card is completely inserted into the slot of the server, the PRSNT #pin is grounded by a short circuit of the PCIE card, the PRSNT #signal generated by the PRSNT #pin is in a low-level state, a source voltage of the second MOS transistor is a turn-on voltage of a body diode of the second MOS transistor, and a gate voltage of the second MOS transistor is still in a high-level state under a pull-up action of the second resistor.

15. The circuit for protecting power supply of the PCIE card according to claim 14, wherein when a voltage difference between the gate voltage and the source voltage of the second MOS transistor is greater than the turn-on voltage of the second MOS transistor, the second MOS transistor is turned on, and the EV_PRSNT signal in a high-level state is pulled down to the ground by the PRSNT #signal flowing through the second MOS transistor, the controller turns on the first MOS transistor according to the PRSNT #signal, and the second power supply directly charges a load.

16. The circuit for protecting power supply of the PCIE card according to claim 14, wherein the preset position is a position of a top of the PRSNT #pin when the PRSNT #pin is completely inserted into the slot of the server, or is a two-third position of the top of the PRSNT #pin when the PRSNT #pin is completely inserted into the slot of the server.

17. The circuit for protecting power supply of the PCIE card according to claim 1, wherein when the PRSNT #pin leaves a preset position of the slot of the server, the PRSNT #signal returns to be in a high-level state under a pull-up action of the first resistor, the voltage difference between the gate voltage and the source voltage of the second MOS transistor is not greater than the turn-on voltage of the second MOS transistor, the second MOS transistor is turned off, the EV_PRSNT signal also returns to be in a high-level state under the pull-up action of the first resistor, and the controller turns off the first MOS transistor according to the EV_PRSNT signal.

18. The circuit for protecting power supply of the PCIE card according to claim 17, wherein the preset position is a position of a top of the PRSNT #pin when the PRSNT #pin is completely inserted into the slot of the server, or is a two-third position of the top of the PRSNT #pin when the PRSNT #pin is completely inserted into the slot of the server.

19. The circuit for protecting power supply of the PCIE card according to claim 1, wherein two PRSNT #pins are arranged and located at two ends of a PCIE gold finger, the two PRSNT #pins are connected together, and a common end of the two PRSNT #pins is connected to the drain of the second MOS transistor.

20. The circuit for protecting power supply of the PCIE card according to claim 1, wherein
  when the PCIE card is just inserted into the slot of the server, the first MOS transistor is turned off, and electric energy released by the second power supply charges a load through a body diode of the first MOS transistor;
  as the PCIE card is further inserted, when the PCIE card is completely inserted into the slot of the server, the controller receives a PRSNT #signal in a low-level state, after the controller receives the PRSNT #signal, a current pump of the controller charges the gate of the first MOS transistor until the gate voltage of the first MOS transistor is greater than the source voltage of the first MOS transistor, the first MOS transistor is turned on, and the second power supply charges the load via the first MOS transistor, the first voltage comparator collects the drain voltage and the source voltage of the first MOS transistor, and outputs a first voltage signal to a third MOS transistor of the controller according to the voltage difference between the drain voltage and the source voltage of the first MOS transistor; in a case where the voltage difference between the drain voltage and the source voltage of the first MOS transistor exceeds a threshold voltage, the first voltage signal output by a first voltage comparator of the controller to the gate of the third MOS transistor is in a high-level state, and the third MOS transistor is turned on, such that the gate and the source of the first MOS transistor are connected, and the gate voltage and the source voltage of the first MOS transistor are equal, so that the first MOS transistor is turned off, and the second power supply is disconnected from the load; in a case where the voltage difference between the drain voltage and the source voltage of the first MOS transistor does not exceed the threshold voltage, the first voltage signal output by the first voltage comparator to the gate of the third MOS transistor is in a low-level state, and the third MOS transistor is not turned on according to the first voltage signal.

\* \* \* \* \*